(12) United States Patent
Kao et al.

(10) Patent No.: US 9,319,046 B2
(45) Date of Patent: Apr. 19, 2016

(54) INTEGRATED CIRCUIT CAPABLE OF PREVENTING CURRENT BACKFLOW TO POWER LINE

(71) Applicant: MStar Semiconductor, Inc., Hsinchu Hsien (TW)

(72) Inventors: Shuo-Ting Kao, Hsinchu County (TW); Chun-Wen Yeh, Hsinchu County (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 0 days.

(21) Appl. No.: 14/605,600

(22) Filed: Jan. 26, 2015

(65) Prior Publication Data
US 2015/0214947 A1    Jul. 30, 2015

(30) Foreign Application Priority Data
Jan. 28, 2014    (TW) .............................. 103103070 A

(51) Int. Cl.
*H03K 19/0175*    (2006.01)
(52) U.S. Cl.
CPC .............................. *H03K 19/017509* (2013.01)

(58) Field of Classification Search
None
See application file for complete search history.

(56) References Cited

U.S. PATENT DOCUMENTS 6,384,632 B2 *    5/2002    Tsuji .............. H03K 19/018592
326/58

* cited by examiner

*Primary Examiner* — Jany Richardson
(74) *Attorney, Agent, or Firm* — WPAT, PC; Justin King

(57) ABSTRACT

An integrated circuit capable of preventing current backflow to a power line is provided. The integrated circuit includes an input circuit. The input circuit includes a bonding pad and a pull-up circuit, a pull-up switch, a bulk controlled switch and a control circuit. The pull-up switch includes a first control node and a first bulk node. The bulk controlled switch includes a second control node and a second bulk node. The control circuit controls the first and second control nodes according to an internal signal, a power voltage of the power line and a pad voltage of the bonding pad. When the power voltage is a predetermined voltage, the control circuit turns on the bulk controlled switch. When the power line is at a ground voltage and the bonding pad voltage is at the predetermined voltage, the control circuit turns off the bulk controlled switch and the pull-up switch.

16 Claims, 6 Drawing Sheets

INTEGRATED CIRCUIT CAPABLE OF PREVENTING CURRENT BACKFLOW TO POWER LINE

This application claims the benefit of Taiwan application Serial No. 103103070, filed Jan. 28, 2014, the subject matter of which is incorporated herein by reference.

BACKGROUND OF THE INVENTION

1. Field of the Invention

The invention relates in general to an input circuit of an integrated circuit, and more particularly to an input circuit capable of preventing current backflow.

2. Description of the Related Art

Communications between electronic products may be achieved through physical transmission lines and special communication standards. In general, an integrated circuit that provides signals may be referred to as a source integrated circuit, and an integrated circuit that receives signals through transmission lines may be referred to as a sink integrated circuit.

Differential signals are adopted by many communication standards to achieve quite high communication signal transmission speeds. However, for high-speed communications, a sink integrated circuit frequently requires a termination resistor for reducing signal reflection and increasing the transmission speed. For example, a termination resistor may be installed in a sink integrated circuit and be connected between a bonding pad and a power line. During normal signal transmission, a power line of the source integrated circuit and the power line of the sink integrated circuit jointly drive transmission lines connected.

When an electronic product including the sink integrated circuit is turned off, a power voltage of a power line of the sink integrated circuit theoretically drops to 0V as time passes. However, in practice, it is possible that the power line of the source integrated circuit feed a backflow current to the power line of the sink integrated circuit through the transmission line and the termination resistor of the sink integrated circuit, resulting in a voltage greater than 0V. Such current backflow may cause in errors in default values of the sink integrated circuit when the electronic device including the sink integrated circuit is again turned on. Therefore, there is a need for a solution that considers and prevents current backflow.

SUMMARY OF THE INVENTION

According to an embodiment of the present invention, an integrated circuit capable of preventing current backflow to a power line is provided. The integrated circuit includes an input circuit. The input circuit includes a bonding pad, a pull-up switch, a bulk controlled switch and a control circuit. The pull-up switch includes a first control node and a first bulk node, and electrically connects the bonding pad to the power line. The bulk controlled switch includes a second control node and a second bulk node, and connects the first bulk node and the second bulk node to the power line. The control circuit is electrically connected to the power line and the bonding pad, and controls the first control node and the second control node. When the power line is at a predetermined voltage, the control circuit turns on the bulk controlled switch. When the power line is at a ground voltage and the bonding pad voltage is at the predetermined voltage, the control circuit turns off the bulk controlled switch and the pull-up switch.

According to another embodiment of the present invention, an integrated circuit capable of preventing current backflow to a power line is provided. The integrated circuit includes an electrostatic discharge (ESD) bus, a plurality of input circuits, and a bus connecting circuit. Each of the input circuits includes a bonding pad and an ESD diode. The ESD diode is connected between the bonding pad and the ESD bus. The bus connecting circuit is electrically connected between the ESD bus and the power line, and controls an electrical connection between the ESD bus and the power line according to a power voltage of the power line and a plurality of bonding pad voltages of the bonding pads.

The above and other aspects of the invention will become better understood with regard to the following detailed description of the preferred but non-limiting embodiments. The following description is made with reference to the accompanying drawings.

BRIEF DESCRIPTION OF THE DRAWINGS

FIG. 4 shows a detailed example of an input circuit 302a;

DETAILED DESCRIPTION OF THE INVENTION

Figure 1:
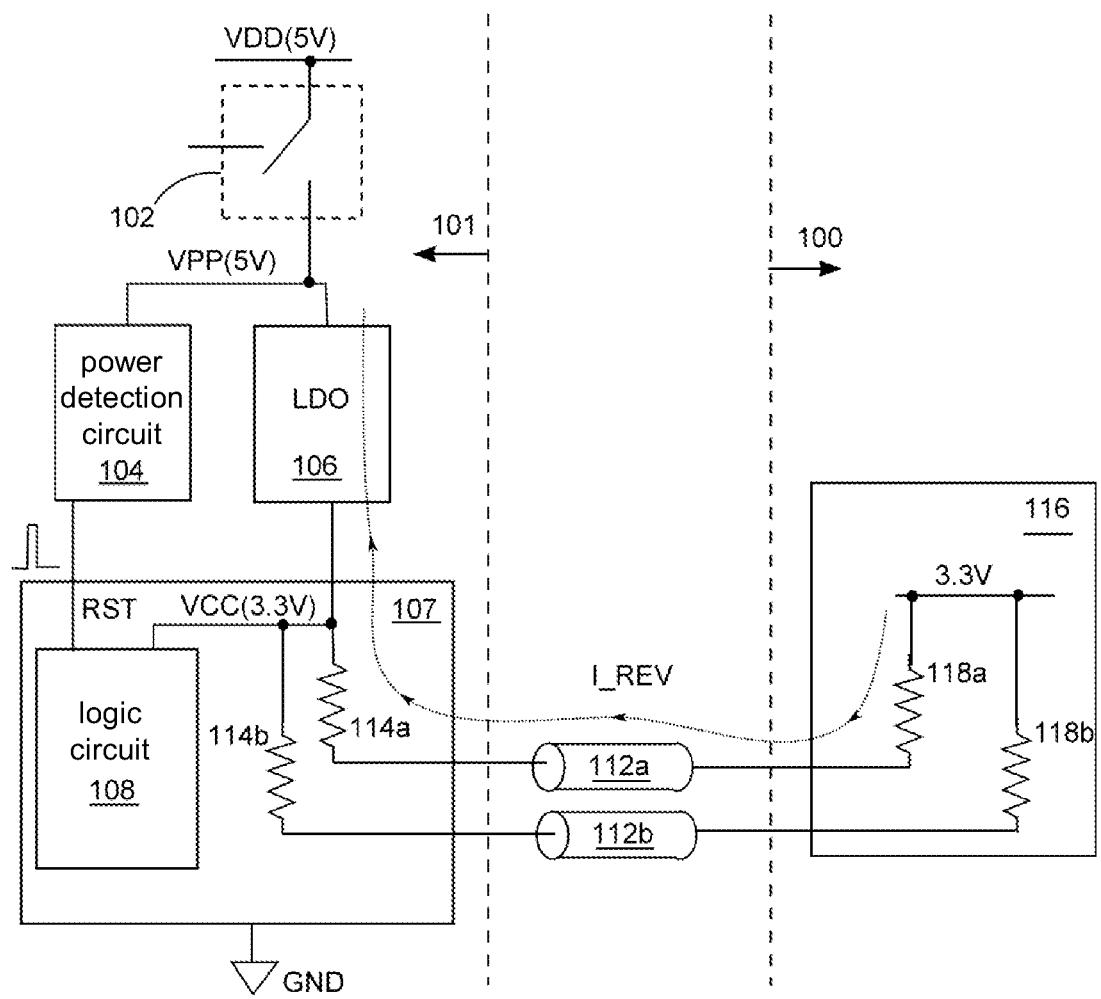
FIG. 1 shows two electronic devices 100 and 101 connected by transmission lines 112a and 112b.

FIG. 1 shows two electronic devices 100 and 101 connected by transmission lines 112a and 112b. The electronic device 100 includes a source integrated circuit 116, which sends differential signals to a sink integrated circuit 107 in the electronic device 101 through the transmission lines 112a and 112b. For example, the electronic device 100 is a multimedia player, the electronic device 101 is an LCD television, and the transmission lines 112a and 112b are two transmission lines such as High-Definition Multimedia Interface (HDMI) cables. As shown, the source integrated circuit 116 includes termination resistors 118a and 118b connected to a 3.3V power line. The sink integrated circuit 107 includes termination resistors 114a and 114b electrically connected to a power line VCC. The termination resistors 114a, 114b, 118a and 118b are all for matching impedance of the transmission lines 112a and 112b. In normal operations, a power voltage of the power line VCC is 3.3V.

The electronic device 101 includes a main power switch 102. For example, the main power switch 102 may be a main power switch of a television. When the main power switch 102 is turned on, a low dropout regulator (LDO) 106 is powered by a 5V power line VPP and provides the power line VCC with a 3.3V power source. When the main power switch 102 is open circuit (turned off), the power line VPP is expectedly 0V (ground voltage). When the main power switch 102 changes from open circuit to close circuit (turned on), a detection circuit 104 ideally detects a rising edge of the voltage of the power line VPP, and resets the sink integrated circuit 107 via a reset node RST to restore certain settings in a logic circuit 108 to default values.

However, as shown in FIG. 1, when the main power switch 102 is turned off (open circuit), although the LDO 106 does not provide power to the power line VCC, the power voltage of the power line VCC may stay at 3.3V due to current backflow caused by the 3.3V power line in the source integrated circuit 116. That is to say, although the main power switch 102 is turned off, the voltage of the power line VPP, instead of being the expected value of 0V, may be about 2V due to slight current leakage of the LDO 106 from the 3.3V power line VCC. As shown in FIG. 1, a backflow current I_REV charges the power line VPP. At this point, once the main power switch 102 changes from open circuit to close circuit, instead of rising from 0V to 5V, the voltage of the power line VPP starts to rise from 2V to 5V due to the current leakage of the LDO 106. Hence, the power detection circuit 104 frequently fails to detect the rising edge such that the sink integrated circuit 107 cannot be reset. Consequently, certain settings in the logic circuit 108 cannot be restored to default values, leading to malfunctions of the electronic device 101.

Figure 2:
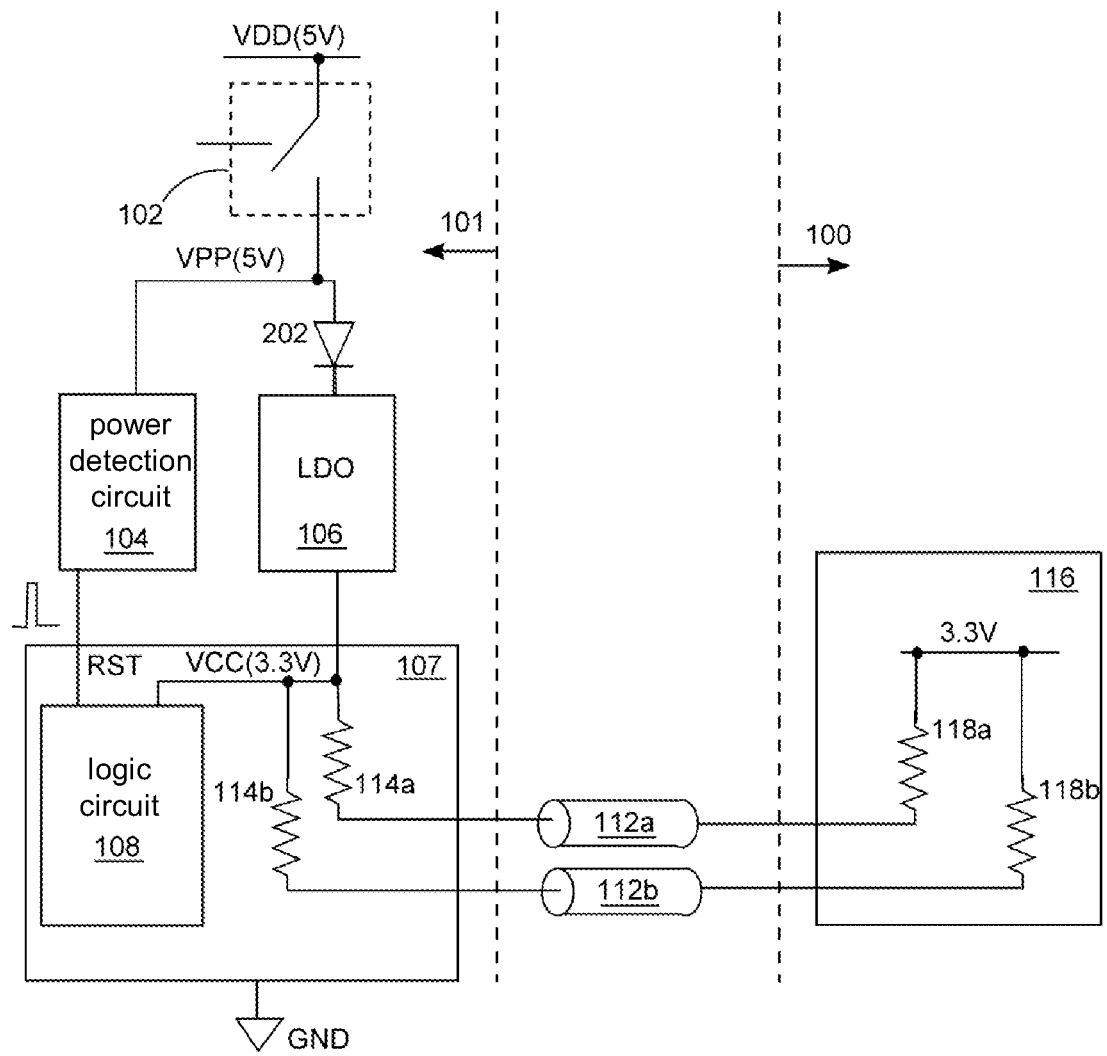
FIG. 2 shows a system solution capable of preventing current backflow in FIG. 1.

FIG. 2 shows a system solution capable of preventing current backflow. Compared to FIG. 1, an additional diode 202 is included in FIG. 2. The diode is a discrete device connected between the power line VPP and the LDO 106, and is capable of blocking the backflow current I_REV. Therefore, when the main power switch 102 is turned off, the voltage of the power line VPP maintains at about the expected value of 0V. However, with the additional discrete device, complications in procurement, production management and manufacturing may be increased.

Figure 3:
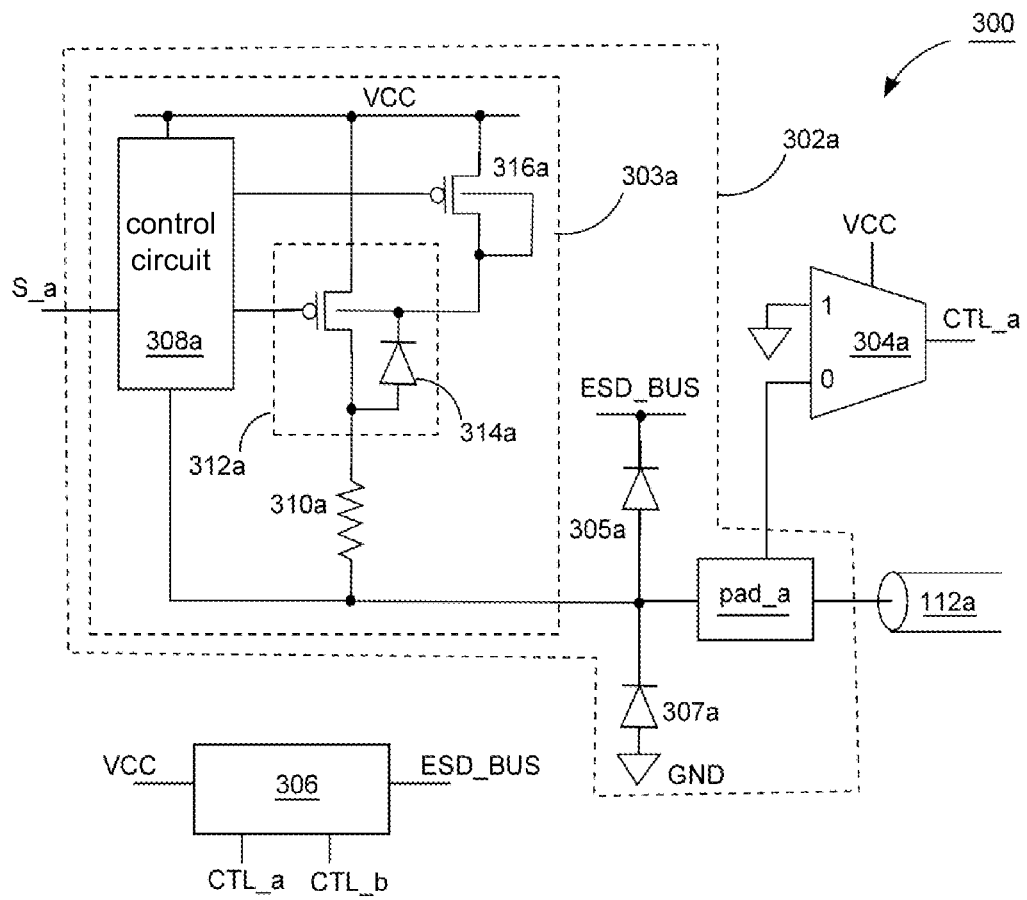
FIG. 3 shows a sink integrated circuit 300 according to an embodiment of the present invention.

FIG. 3 shows a sink integrated circuit 300 according to an embodiment of the present invention. For illustration purposes, the sink integrated circuit in FIG. 1 is replaced by sink integrated circuit 300 in FIG. 3. It should be noted that, the present invention is not limited to the system architecture in FIG. 1, and may be applied to other system architectures.

The sink integrated circuit 300 includes input circuits 302a and 302b, multiplexers 304a and 304b, and a connecting circuit 306. The input circuits 302a and 302b are electrically connected to the power lines 112 and 112b via bonding pads pad_a and pad_b, respectively, receive differential signals transmitted from the source integrated circuit 116, and are further capable of preventing the source integrated circuit 116 from feeding a backward current to the power line VCC. The multiplexers 304a and 304b and the connecting circuit 306 may be regarded as a bus connecting circuit, which is structured to control an electrical connection between the electrostatic discharge (ESD) bus ESD_BUS and the power line VCC according to the voltages of the power line VCC, the bonding pad pad_a, and the bonding pad pad_b.

The multiplexer 304a selects one of the ground line GND and the bonding pad pad_a according to the power voltage of the power line VCC, and connects the selected ground line GND or bonding pad pad_a to a control node CTL_a. Similarly, the multiplexer 304b selects one of the ground line GND and the bonding pad pad_b according to the power voltage of the power line VCC, and electrically connects the selected ground line GND or bonding pad pad_b to a control node CTL_b. According to the control nodes CTL_a and CTL_b, the connecting circuit 306 controls the electrical connection between the ESD bus ESD_BUS and the power line VCC.

To coordinate with the two transmission lines 112a and 112b, the sink integrated circuit 300 only utilizes two inputs circuits 302a and 302b an example. In other embodiments of the present invention, an integrated circuit may have only one input circuit or may have more than two input circuits. For example, an integrated circuit according to an embodiment of the present invention has three input circuits, three multiplexers, and one connecting circuit.

The circuit architectures and operations of the input circuits 302a and 302b are similar. Details of the input circuit 302a are given below, and the description of the input circuit 302b may be obtained with reference to that of the input circuit 302a and shall be omitted herein.

The input circuit 302a includes a pull-up circuit 303a, ESD diodes 305a and 307a, and a bonding pad pad_a.

The pull-up circuit 303a pulls up the bonding pad pad_a to 3.3V. In the pull-up circuit 303a, a PMOS 312a and a termination resistor 310a are connected in series between the power line VCC and the bonding pad pad_a. The PMOS 312a may be regarded as a pull-up switch, and is capable of pulling up a pad voltage of the bonding pad pad_a when turned on. A PMOS 316a and a parasitic body diode 314a in the PMOS 312a are connected in series between the termination resistor 310a and the power line VCC. The PMOS 316a and the body diode 314a are for controlling whether to electrically connect a bulk node of the PMOS 312a to the power line VCC, and may be regarded as a bulk controlled switch. A control circuit 308a controls gates of the PMOS 312a and 316a according to the power voltage of the power line VCC, the pad voltage of the bonding pad pad_a, and an internal signal S_a.

The ESD diode 305a provides the bonding pad pad_a with an ESD path to the ESD bus ESD_BUS. The ESD diode 307a provides the bonding pad pad_a with another ESD path to the ground line GND.

Figure 4:
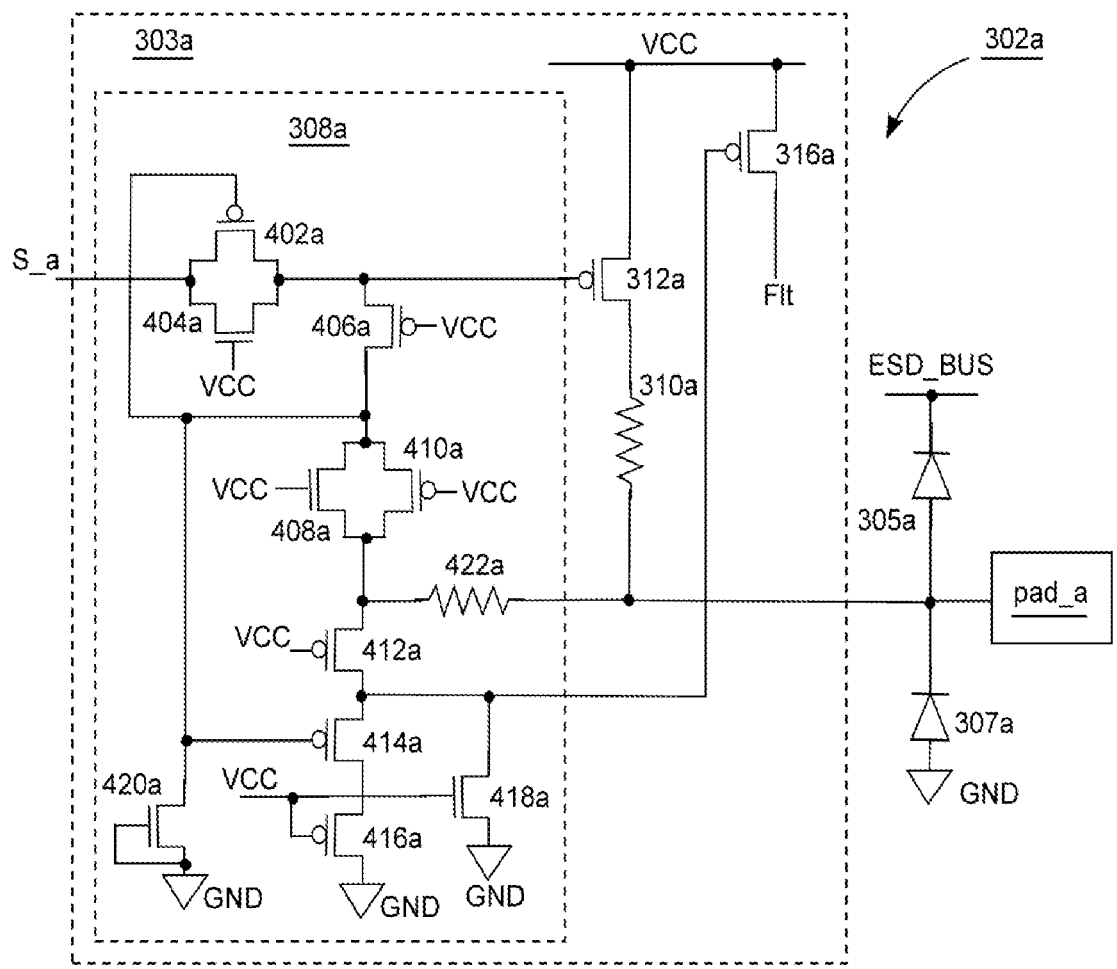

FIG. 4 shows details of the input circuit 302a. To keep FIG. 4 simple, although not depicted, all bulk nodes of the PMOSs in the input circuit 302a are electrically connected to a floating end Flt.

A PMOS 402a and an NMOS 404a connected in parallel may be regarded as a transmission circuit that sends the internal signal S_a to the gate of the PMOS 312a. The gate of the NMOS 404a is electrically connected to the power line VCC. The gate of the PMOS 402a is electrically connected to an NMOS 420a, which has its gate connected to the ground line GND.

Between a resistor 422a and the gate of the PMOS 312a are PMOSs 406a and 410a as well as an NMOS 408a, which all have their gates electrically connected to the power line VCC. The NMOS 408a and the PMOS 410a are connected in parallel. From another perspective, the PMOSs 406a and 410a are connected in series between a resistor 422a and the gate of the PMOS 312a.

Between the resistor 422a and the ground line GND are PMOSs 412a, 414a and 416a as well as an NMOS 418a. The PMOSs 412a, 414a and 416a are sequentially connected in series between the resistor 422a and the ground line GND. The NMOS 418a is connected between the gate of the PMOS 316a and the ground line. The gate of the PMOS 414a is connected to the gate of the PMOS 402a. The gates of the PMOSs 412a 416a and the NMOS 418a are all electrically connected to the power line VCC.

Figure 5A:
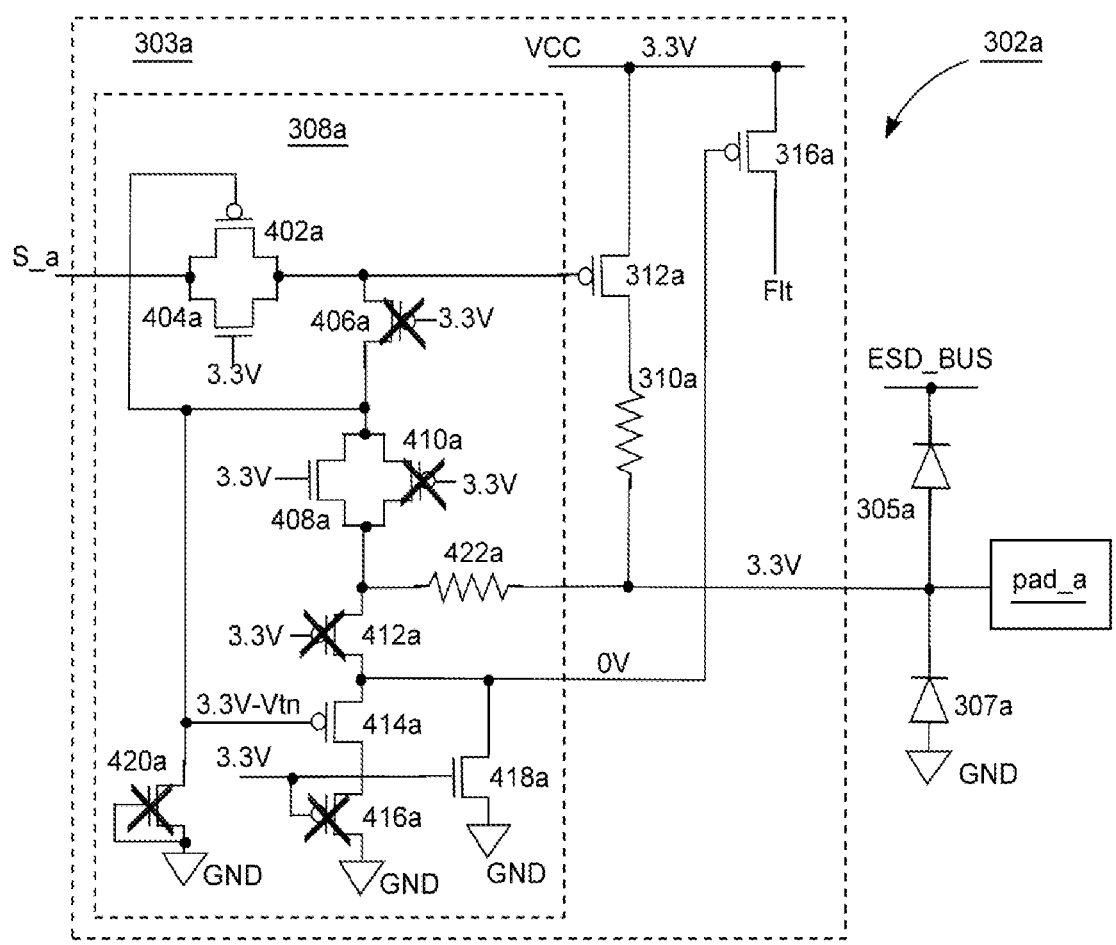
FIG. 5A shows on/off statuses of MOS transistors in FIG. 4 when a power voltage of a power line VCC and a pad voltage of a bonding pad pad_a are both 3.3V.

FIG. 5A shows on/off statuses of the MOS transistors in FIG. 4 when the power voltage of the power line VCC and the pad voltage of the bonding pad pad_a are both 3.3V. The MOS transistors marked with a cross are turned off, and those without are turned on or slightly turned on. As seen from FIG. 5A, the turned on NMOS 418a maintains the PMOS 316a in a turned on status, and so the floating end Flt, i.e., the bulk nodes of all the PMOSs in FIG. 4, is connected to the power line VCC and is 3.3V.

Despite that the NMOS 420a is turned off, the NMOS 420a provides a leakage current path to slightly pull down the gate of the PMOS 402a. The NMOS 408a causes the voltage at the gate of the PMOS 402a to be not higher than 3.3V subtracted by a threshold voltage Vtn of the NMOS 408a. Thus, the PMOS 402a may be slightly or completely turned on. Further, the NMOS 404a and the PMOS 402a, which are in parallel connection and turned on, allow the internal signal S_a to arrive at the gate of the PMOS 312 to turn on or turn off the PMOS 312a.

Figure 5B:
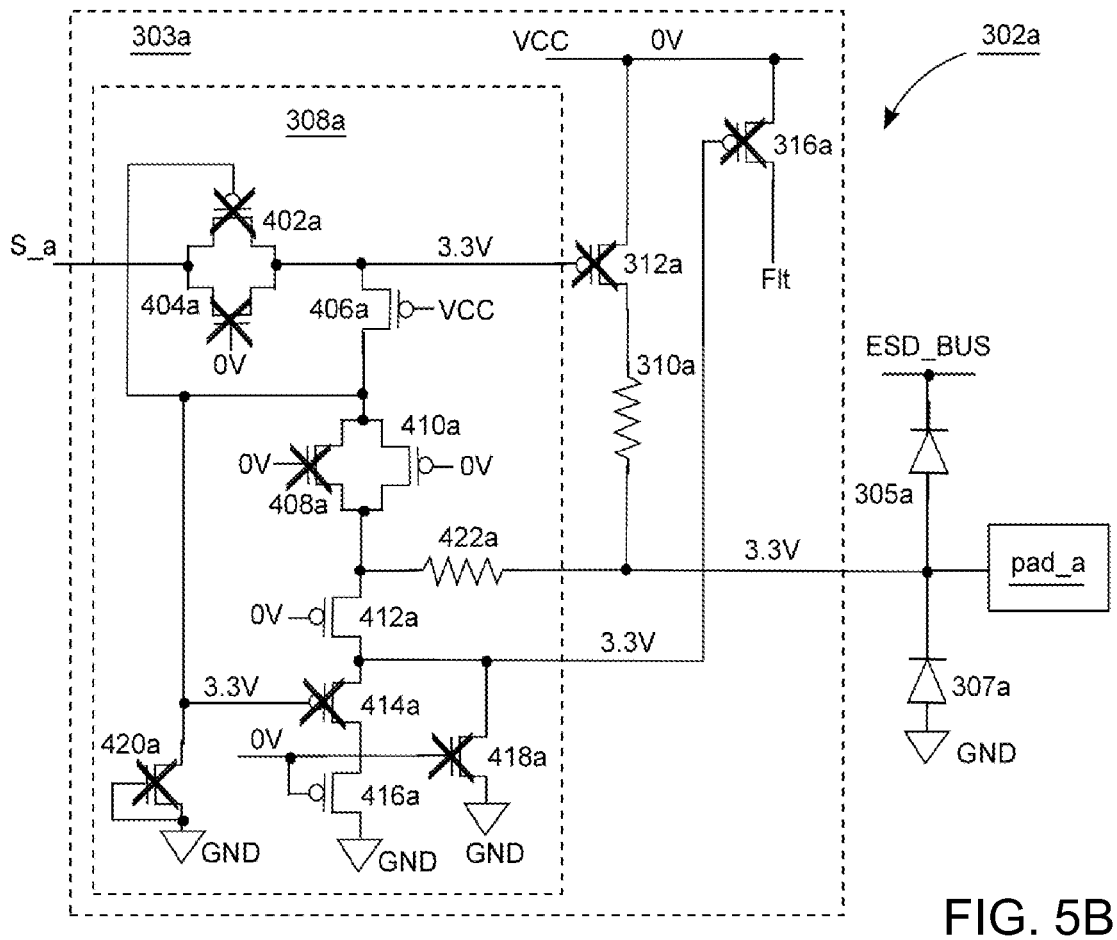
FIG. 5B is shows on/off statuses of MOS transistors in FIG. 4 when a power voltage of a power line VCC is 0V and a pad voltage of a bonding pad pad_a is 3.3V.

FIG. 5B shows on/off statuses of the MOS transistors in FIG. 4 when the power voltage of the power line VCC is 0V and the pad voltage is 3.3V. Similarly, the MOS transistors marked with a cross are turned off, and those without are turned on or slightly turned on. The PMOS 410a that is turned on causes the gate of the PMOS 402a to be 3.3V. The PMOS 402a and the NMOS 404a that are turned off insulate the gate of the PMOS 312a and the internal signal S_a. Similarly, the PMOS 414a that is turned off prevents the PMOS 316a from being turned on. As seen from FIG. 5B, the PMOS 412a that is turned on electrically connects the bonding pad pad_a to the gate of the PMOS 316a, and thus turns off the PMOS 316a. Similarly, the PMOSs 410a and 406a that are turned on electrically connect the bonding pad pad_a to the gate of the PMOS 312a, and thus turn off the PMOS 312a. Therefore, at this point, the power line VCC having a power voltage of 0V is safely electrically insulated from the bonding pad pad_a having a bonding voltage of 3.3V, hence ensuring that the power line VCC is not fed with a current and preventing current backflow. Theoretically, the voltage of the floating end Flt is about a value of subtracting 3.3V by a forward bias of the parasitic body diode (314 in FIG. 3) in the PMOS 312a.

Figure 6:
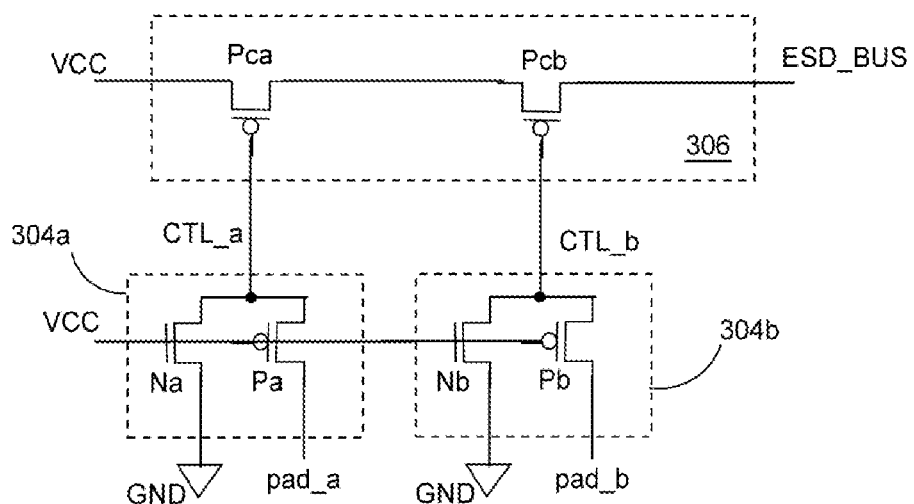
FIG. 6 shows an example of multiplexers 304a and 304b in FIG. 3 and a connecting circuit 306.

FIG. 6 shows an example of the multiplexers 304a and 304b and the connecting circuit 306 in FIG. 3. To keep FIG. 6 simple, although not depicted, bulk nodes of all the PMOSs in FIG. 6 are electrically connected to the ESD bus ESD_BUS.

Taking the multiplexer 304a for example, it includes an NMOS Na and a PMOS Pa. When the power voltage of the power line VCC is 0V, the NMOS Na is turned off and the PMOS Pa is turned on, and so the multiplexer 304a electrically connects the bonding pad pad_a to a control node CTL_a. Conversely, when the power voltage of the power line VCC is 3.3V, the NMOS Na is turned on and the PMOS Pa is turned off, and so the multiplexer 304a electrically connects the ground line GND to the control node CTL_a.

As seen from FIG. 6, when the power voltage of the power line VCC is 3.3V, the gates of PMOSs Pca and Pcb are both 0V. In the connecting circuit 306, the PMOSs Pca and Pcb connected in series are turned on, and so the connecting circuit 306 electrically connects the power line VCC and the ESD bus ESD_BUS. At this point, the ESD bus ESD_BUS is short-circuited to the power line VCC, and has a voltage of about 3.3V.

When the power voltage of the power line VCC is 0V, given that the pad voltage of any bonding pad is 3.3V, the connecting circuit 306 insulate the power line VCC and the ESD bus ESD_BUS. At this point, although the voltage of the ESD bus may be pulled up to about 2.5V due to an ESD diode 305a or 305b that is turned on, the 2.5V ESD bus ESD_BUS does not provide the 0V power line with a charging effect due to the insulation provided by the connecting circuit 306. Possible current backflow that the bonding pads pad_a and pad_b generate on the power line VCC can be prevented.

As demonstrated by the above description, when the sink integrated circuit in FIG. 1 is replaced by the sink integrated circuit 300 in FIG. 3 and the main power switch 102 is turned off, no current backflow is incurred, and both the power lines VCC and VPP can be maintained at 0V. Therefore, when the main power switch 102 is turned on, the power detection circuit 104 is capable of correctly detecting the rising edge of the voltage of the power line VPP in order to reliably reset the sink integrated circuit 107.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An integrated circuit, capable of preventing current backflow to a power line, comprising:
    an input circuit, comprising:
        a bonding pad, configured to electrically connect to an external signal line;
        a pull-up switch, comprising a first control node and a first bulk node, configured to electrically connect the bonding pad to the power line;
        a bulk controlled switch, comprising a second control node and a second bulk node, configured to connect the first bulk node and the second bulk node to the power line; and
        a control circuit, electrically connected to the power line and the bonding pad, configured to control the first control node and the second control node;
    wherein, when the power line is at a predetermined voltage, the control circuit turns on the bulk control switch; when the power line is at a ground voltage and the bonding pad is at the predetermined voltage, the control circuit turns off the bulk controlled switch and the pull-up switch.

2. The integrated circuit according to claim 1, wherein when the power line is at the predetermined voltage, the control circuit controls the pull-up switch according to an internal signal.

3. The integrated circuit according to claim 1, wherein when the power line is at the ground voltage, the control circuit electrically connects the bonding pad to the first control node and the second control node.

4. The integrated circuit according to claim 1, wherein the control circuit comprises:
    a transmission circuit, configured to transmit an internal signal to the first control node, comprising:
        a first NMOS and a first PMOS that are connected in parallel, the first NMOS and the first PMOS configured to transmit the internal signal to the first control node, a gate of the first NMOS electrically connected to the power line;
    a first circuit, connected between the first control node and the bonding pad, comprising:
        a second NMOS and a second PMOS that are connected in parallel, the second NMOS and the second PMOS configured to electrically connect the bonding pad to a gate of the first PMOS, two gates of second NMOS and the second PMOS electrically connected to the power line; and
        a third PMOS, having a gate electrically connected to the power line, configured to electrically connect the first control node to the gate of the first PMOS; and
    a second circuit, electrically connected between the second control node and the bonding pad, comprising:
        a fourth PMOS, a fifth PMOS and a sixth PMOS that are connected in series between the bonding pad and a ground line, two gates of the fourth PMOS and the sixth PMOS electrically connected to the power line, a gate of the fifth PMOS connected to the gate of the first PMOS; and a third NMOS, electrically connecting the second control node to the ground line, having a gate electrically connected to the power line.

5. The integrated circuit according to claim 4, wherein each of the PMOSs in the control circuit comprises a bulk that is electrically connected to the first bulk.

6. The integrated circuit according to claim 4, wherein the control circuit further comprises a fourth NMOS, the fourth NMOS is electrically connected between the gate of the first PMOS and the ground line, and a gate of the fourth NMOS is electrically connected to the ground line.

7. The integrated circuit according to claim 1, wherein the pull-up switch and a first resistor are connected in series between the bonding pad and the power line, the control circuit comprises a second resistor electrically connected to the bonding pad, and the first resistor is for matching impedance of the external signal line.

8. The integrated circuit according to claim 1, the input circuit being a first input circuit, the integrated circuit further comprising a second input circuit, each of the input circuits comprising an electrostatic discharge (ESD) diode connected between an ESD bus and a corresponding bonding pad, the integrated circuit further comprising:

a bus connecting circuit, connected between the ESD bus and the power line, configured to control an electrical connection between the ESD bus and the power line according to a power voltage of the power line, a pad voltage of the bonding pad of the first input circuit and a pad voltage of the bonding pad of the second input circuit.

9. An integrated circuit, capable of preventing current backflow to a power line, comprising:

an electrostatic discharge (ESD) bus;

a plurality of input circuits, each comprising:
   a bonding pad; and
   an ESD diode, connected between the bonding pad and the ESD bus; and a bus connecting circuit, electrically connected between the ESD bus and the power line, configured to control an electrical connection between the ESD bus and the power line according to a power voltage of the power line and a plurality of bonding voltages of the bonding pads.

10. The integrated circuit according to claim 9, wherein when the power voltage is a predetermined voltage, the power line electrically connects to the ESD bus.

11. The integrated circuit according to claim 9, wherein the bus connecting circuit comprises:

a connecting circuit, connected between the ESD bus and the power line; and a plurality of multiplexers, respectively corresponding to the input circuits, each configured to connect a ground line or one of the pads corresponding to an input circuit to the connecting circuit according to the power voltage.

12. The integrated circuit according to claim 11, wherein each of the multiplexers comprises an NMOS and a PMOS, the NMOS is electrically connected between the connecting circuit and the ground line, the PMOS is electrically connected between the connecting circuit and the pad of the corresponding input circuit, and two gates of the NMOS and the PMOS are both electrically connected to the power line.

13. The integrated circuit according to claim 11, wherein the connecting circuit comprises a plurality of PMOSs connected in series, and a gate of each of the PMOSs is electrically connected to a corresponding multiplexer.

14. The integrated circuit according to claim 11, wherein the connecting circuit and the multiplexers comprise a plurality of PMOSs, and a bulk node of each of the PMOSs is electrically connected to the ESD bus.

15. The integrated circuit according to claim 9, wherein each of the input circuit further comprises:

a pull-up switch, comprising a first control node and a first bulk node, configured to electrically connect the bonding pad to the power line;

a bulk controlled switch, comprising a second control node and a second bulk node, configured to connect the first bulk node and the second bulk node to the power line; and a control circuit, electrically connected to the power line and the bonding pad, configured to control the first control node and the second control node;

wherein, when the power voltage is a predetermined voltage, the control circuit turns on the bulk controlled switch; when the power voltage is a ground voltage and the pad voltage is the predetermined voltage, the control circuit turns off the bulk controlled switch and the pull-up switch.

16. The integrated circuit according to claim 15, wherein when the power voltage is the predetermined voltage, the control circuit controls the pull-up switch according to an internal signal.

* * * * *